(12) United States Patent
Yudasaka

(10) Patent No.: US 7,585,717 B2
(45) Date of Patent: Sep. 8, 2009

(54) METHOD OF MANUFACTURING SEMICONDUCTOR DEVICE, SEMICONDUCTOR DEVICE AND ELECTRONIC APPARATUS THEREFORE

(75) Inventor: Ichio Yudasaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 461 days.

(21) Appl. No.: 11/564,460

(22) Filed: Nov. 29, 2006

(65) Prior Publication Data

US 2007/0148839 A1    Jun. 28, 2007

(30) Foreign Application Priority Data

Dec. 27, 2005    (JP)    ............. 2005-375966

(51) Int. Cl.
*H01L 21/336*    (2006.01)
(52) U.S. Cl. .............. 438/197; 438/204; 438/206; 438/266; 257/E21.412; 257/E21.413; 257/E21.414; 257/E21.415
(58) Field of Classification Search ........ 438/197, 438/204, 266, 206; 257/E21.412, E21.413, 257/E21.414, E21.415
See application file for complete search history.

(56) References Cited

U.S. PATENT DOCUMENTS 5,818,070 A * 10/1998 Yamazaki et al. ........... 257/72

6,537,862 B2 * 3/2003 Song ..................... 438/157
7,002,207 B2 * 2/2006 Kim et al. ................ 257/331

FOREIGN PATENT DOCUMENTS

| JP | A 6-252403 | 9/1994 |
|----|------------|--------|
| JP | A 2003-037272 | 2/2003 |
| JP | A 2003-69036 | 3/2003 |
| JP | A 2004-6736 | 1/2004 |
| JP | A 2004-128508 | 4/2004 |
| JP | A 2005-123404 | 5/2005 |
| JP | A 2005-162571 | 6/2005 |
| JP | A 2005-167132 | 6/2005 |
| JP | A 2005-229107 | 8/2005 |
| JP | A 2005-236290 | 9/2005 |

* cited by examiner

*Primary Examiner*—Long K Tran
(74) *Attorney, Agent, or Firm*—Oliff & Berridge, PLC

(57) ABSTRACT

A method for manufacturing a semiconductor device includes: forming a lower gate electrode over a substrate; forming a sacrifice film over the substrate such that the lower gate electrode is overlapped with the sacrifice film; forming a semiconductor film over the sacrifice film such that the semiconductor film crosses over the lower gate electrode; removing the sacrifice film; forming a lower gate insulating film in an empty space between the lower gate electrode and the semiconductor film, the empty space being obtained by removing the sacrifice film; forming an upper gate insulating film over the semiconductor film; and forming an upper gate electrode over the upper gate insulating film, the upper gate electrode being electrically connected to the lower gate electrode.

11 Claims, 8 Drawing Sheets

METHOD OF MANUFACTURING SEMICONDUCTOR DEVICE, SEMICONDUCTOR DEVICE AND ELECTRONIC APPARATUS THEREFORE

BACKGROUND

1. Technical Field

The present invention relates to a method of manufacturing a semiconductor device with a gate all around structure.

2. Related Art

A transistor of a simple plane type (Planer) which includes one gate electrode is generally known. In addition, there is another transistor having such a structure that a plurality of gate electrodes arranged with the transistor, which contributes to improve an electrical controllability from the gate electrodes to realize a transistor which is excellent in ON/OFF switching characteristic. The electrical controllability will be able to be enhanced by employing, for example, a gate electrode structure (Gate All Around) which encompasses an entire channel section of the transistor. JP-A-6-252403, JP-A-2003-37272 and JP-A-2003-69036 are examples of related art. Those examples disclose an example of a formation of a gate all around transistor by employing a single crystal silicon substrate (SOI (Silicon On Insulator) substrate) on an insulating film.

However, a gate all around MOSFET requires a complex manufacturing process due to a three dimensional structure of a gate electrode. Further, the silicon substrate (wafer) and the SOI substrate which are used for the gate all around MOSFET are expensive and it is difficult for those substrates to be made into a large size for the use of a display.

SUMMARY OF THE INVENTION

Therefore, an advantage of some aspect of the invention is to provide the gate all around MOSFET (semiconductor device) which can be manufactured through a relatively simple process and can employ a relatively inexpensive substrate.

According to an aspect of the invention, a manufacturing method of a semiconductor device according to the invention includes forming a lower gate electrode over a substrate, forming a sacrifice film over the substrate in such a manner the sacrifice film overlaps with the lower gate electrode, forming a semiconductor film over the sacrifice film in such a manner that the semiconductor film crosses over the lower gate electrode, removing the sacrifice film, forming a lower gate insulating film in an empty space which was obtained by removing the sacrifice film between the lower gate electrode and the semiconductor film, forming an upper gate insulating film over the semiconductor layer, and forming an upper gate electrode to be electrically connected to the lower gate electrode on the upper gate insulating film.

According to another aspect of the invention, the manufacturing method of the semiconductor device according to the invention includes forming a lower gate electrode over a substrate, forming a sacrifice film over the substrate in such a manner that the sacrifice film overlaps with the lower gate electrode forming a semiconductor film over the sacrifice film in such a manner that the semiconductor layer crosses over the lower gate electrode, forming an empty space between the lower gate electrode and the semiconductor film by removing the sacrifice film, forming a gate insulating film in the empty space and on the semiconductor layer at a same process, and forming an upper gate electrode to be electrically connected to the lower gate electrode over a portion of the gate insulating layer that is formed over the semiconductor layer.

With the above stated structure, the MOSFET having the gate all around structure can be manufactured with a relatively simple method. Further, the gate all around MOSFET can be manufactured with an inexpensive substrate such as a glass substrate or the like.

It is preferable that the lower gate electrode be formed by a liquid ejection method (an ink jet method).

It is preferable that the sacrifice film including an organic film.

It is preferable that the sacrifice film including a material which can take a desirable selected ratio with regard to the substrate or a primary insulating film to be formed on the substrate, the lower gate electrode film and the semiconductor film when the sacrifice film is removed.

It is preferable that the sacrifice film and the semiconductor film be formed by the liquid ejection method.

It is preferable that the lower gate insulating film is formed by applying a liquid material and that the upper gate insulating film is formed by applying a liquid material.

It is preferable that each of the gate insulating films is formed of a thermally-oxidized film of a semiconductor film.

It is preferable that a semiconductor area is formed by means of an ion implantation using the upper gate electrode as a mask.

As stated above, use of the liquid material enables a formation of the MOSFET having the gate all around structure on a substrate which is more inexpensive or on a larger substrate with a relatively simple manufacturing method and a manufacturing equipment.

The semiconductor device according to the invention is manufactured by the above stated manufacturing method of the semiconductor device.

The electronic apparatus according to the invention uses the above stated semiconductor device.

DESCRIPTION OF EXEMPLARY EMBODIMENTS

Figure 1A:
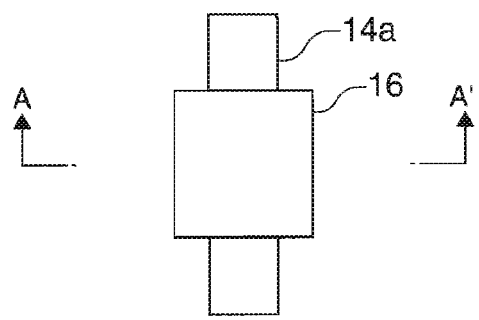
FIGS. 1A and 1B show process drawings illustrating a manufacturing method of a semiconductor device according to the invention.
Figure 1B:
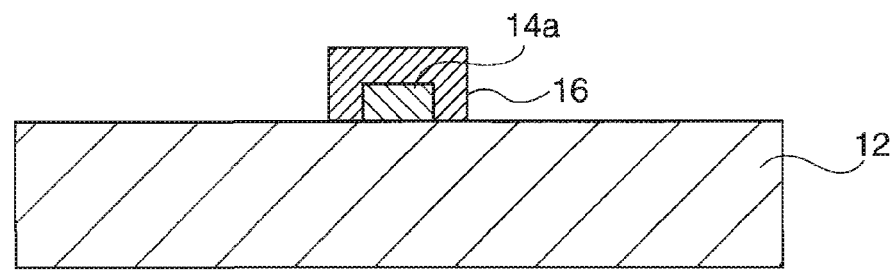
Figure 2A:
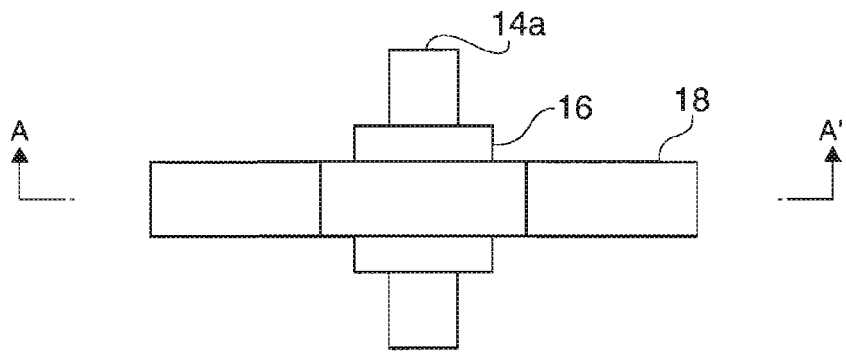
FIGS. 2A and 2B show process drawings illustrating the manufacturing method of the semiconductor device according to the invention.
Figure 2B:
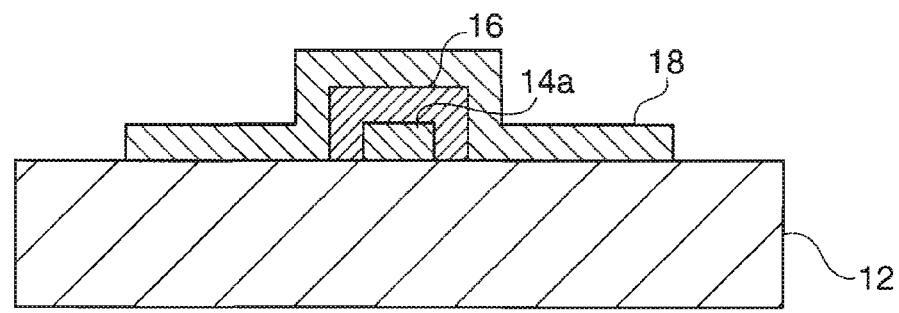
Figure 3A:
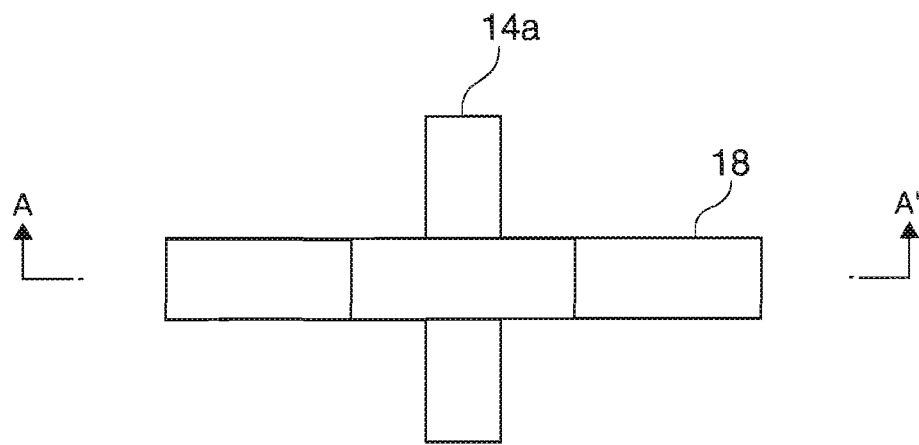
FIGS. 3A and 3B show process drawings illustrating the manufacturing method of the semiconductor device according to the invention.
Figure 3B:
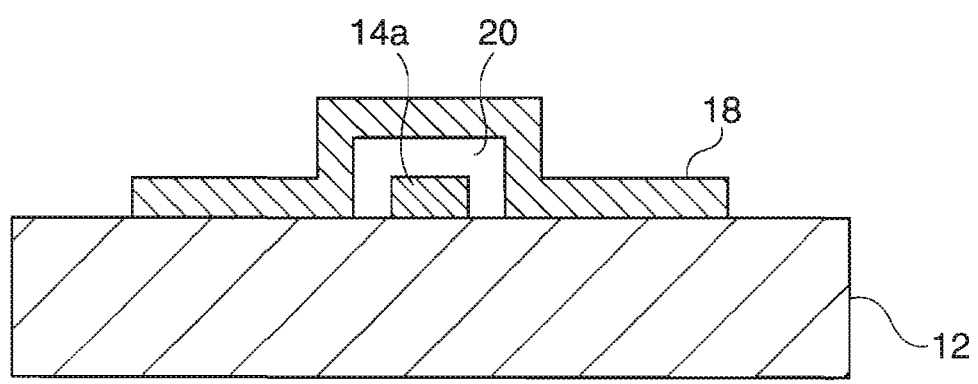
Figure 4A:
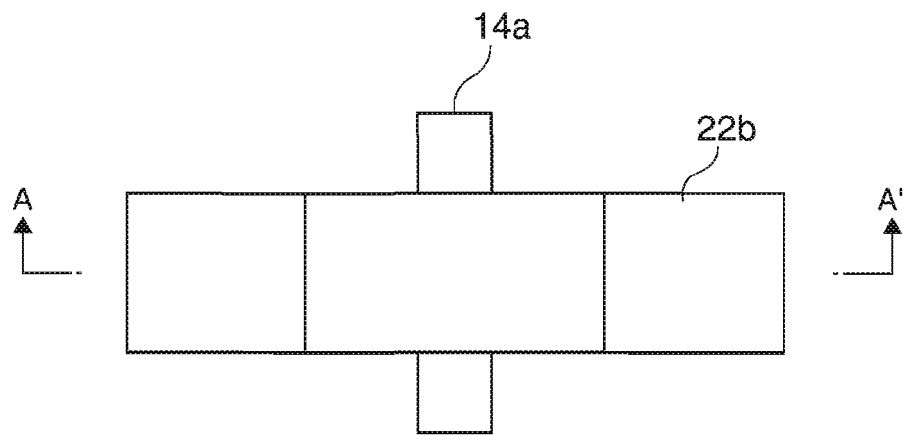
FIGS. 4A and 4B show process drawings illustrating the manufacturing method of the semiconductor device according to the invention.
Figure 4B:
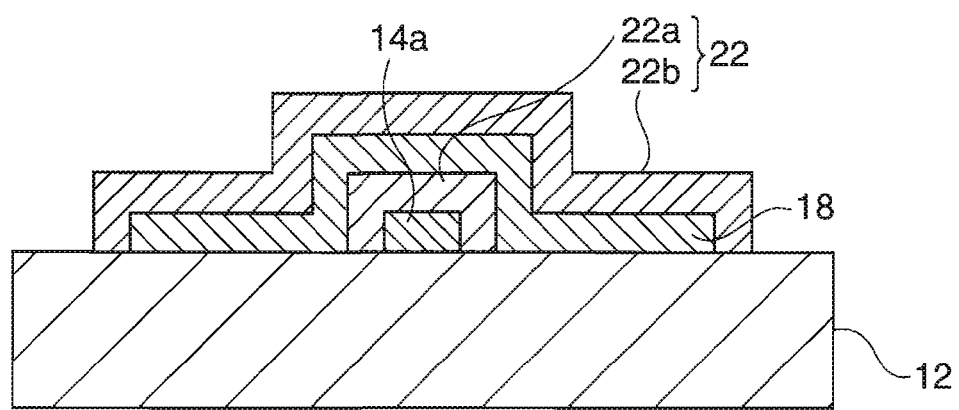
Figure 5A:
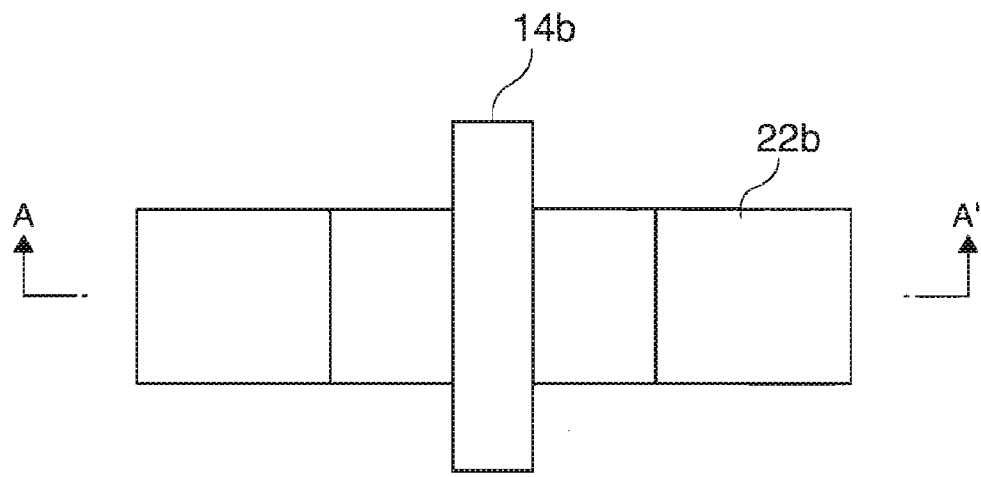
FIGS. 5A and 5B show process drawings illustrating the manufacturing method of the semiconductor device according to the invention.
Figure 5B:
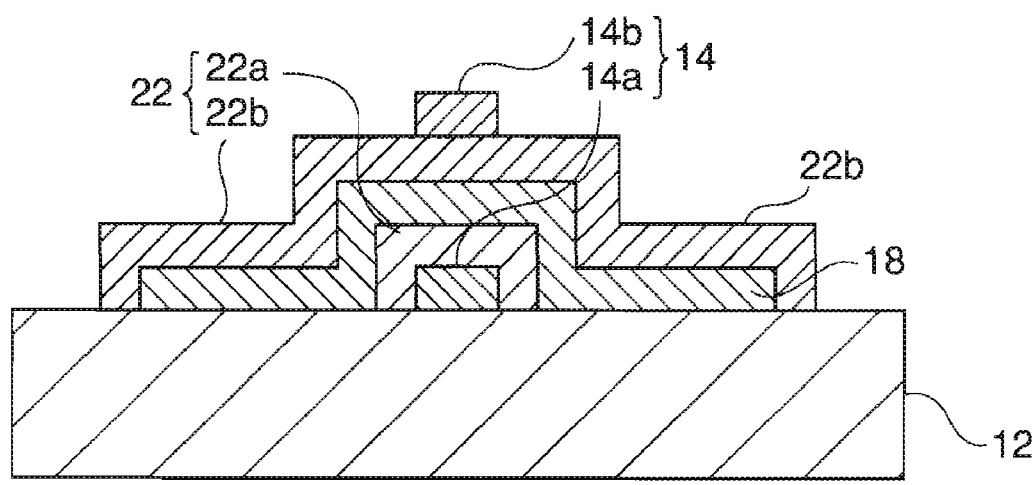
Figure 6A:
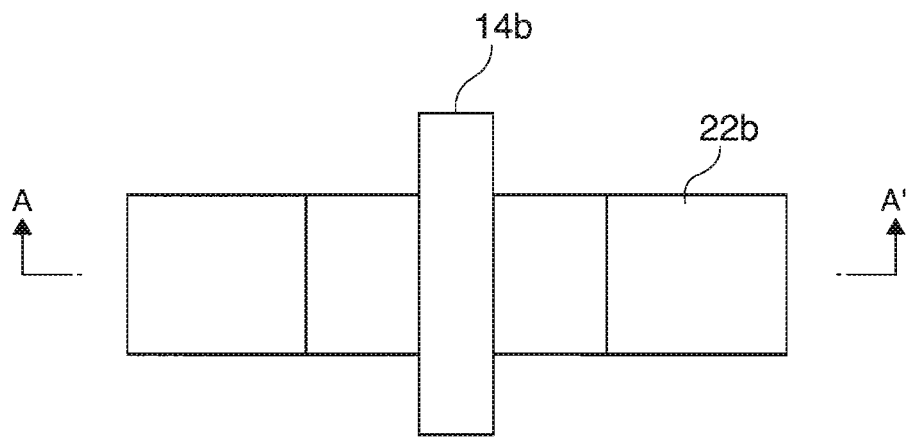
FIGS. 6A and 6B show process drawings illustrating the manufacturing method of the semiconductor device according to the invention.
Figure 6B:
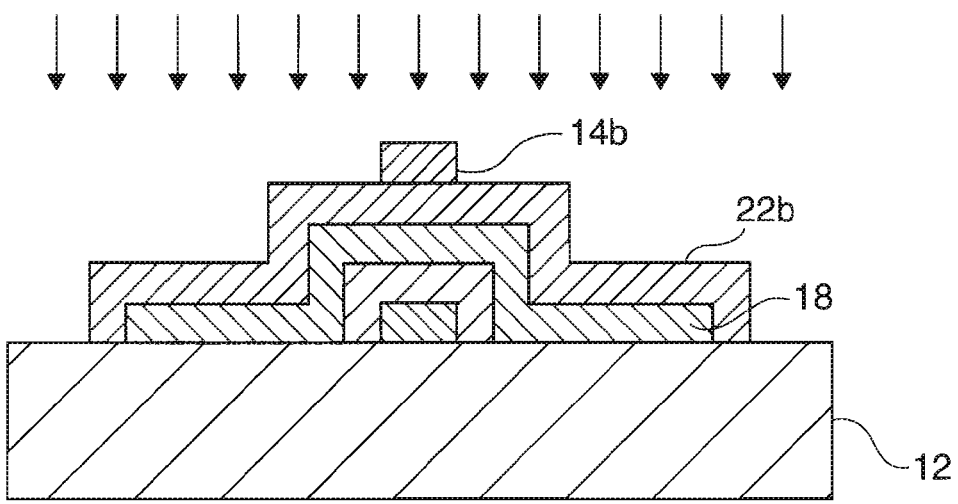
Figure 7A:
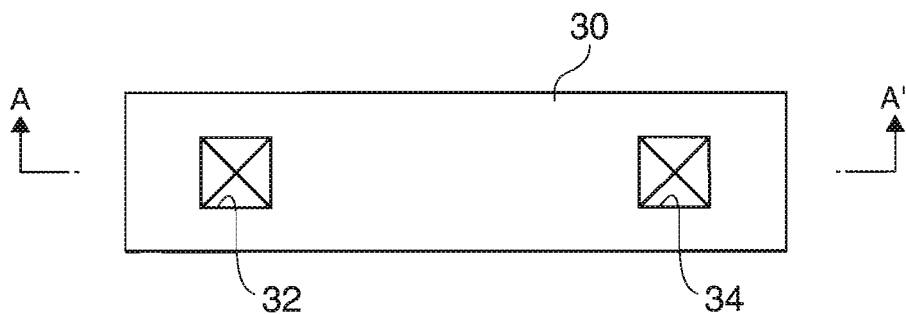
FIGS. 7A and 7B show process drawings illustrating the manufacturing method of the semiconductor device according to the invention.
Figure 7B:
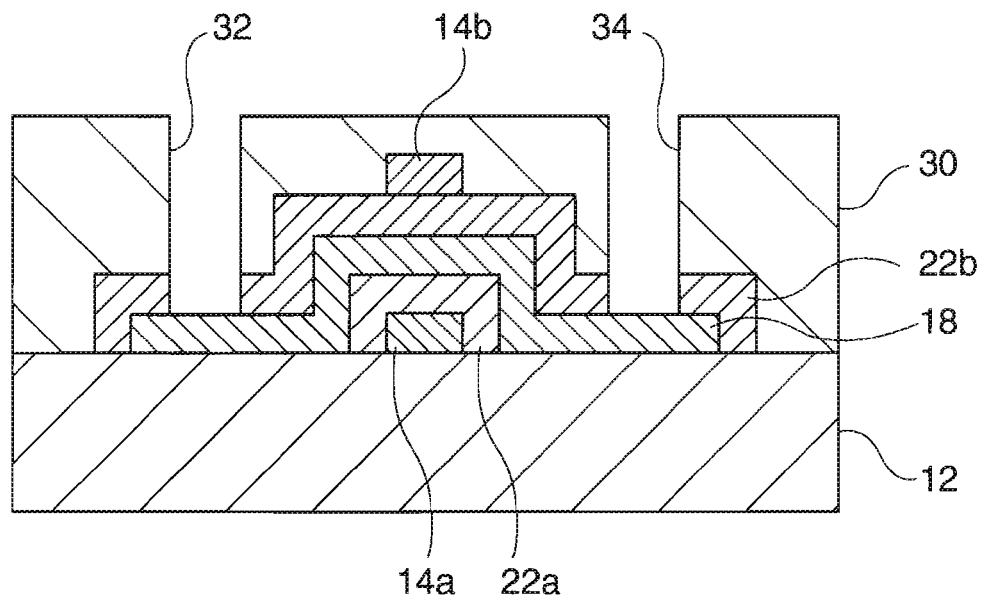

An embodiment of the invention is explained hereinafter, referring to the drawings attached hereto.

Figure 8A:
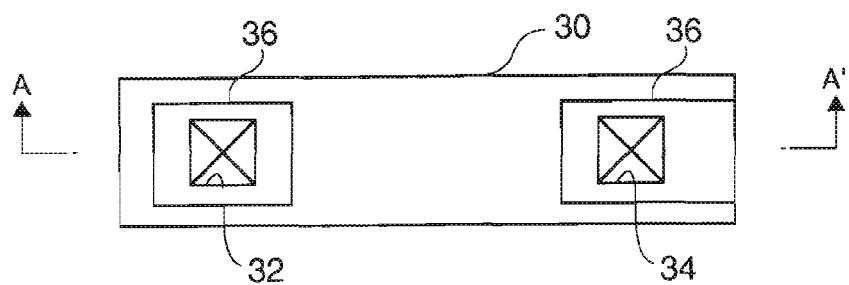
FIGS. 8A and 8B show process drawings illustrating the manufacturing method of the semiconductor device according to the invention.
Figure 8B:
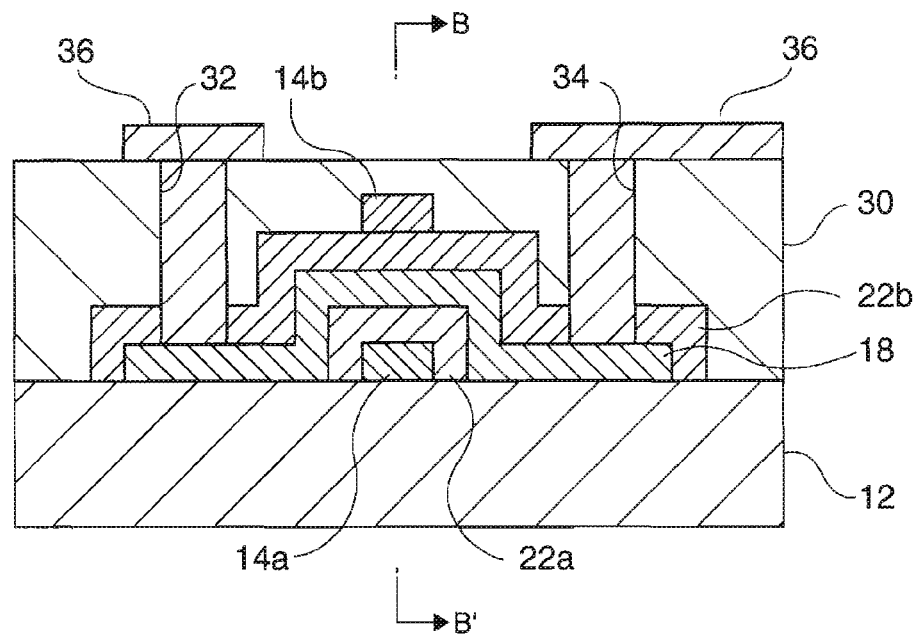
Figure 9:
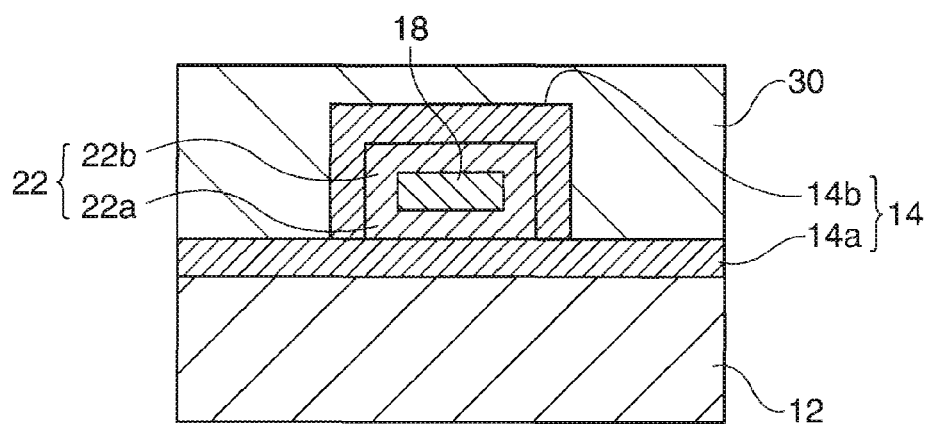
FIG. 9 is a cross sectional view illustrating a cross section taken in line B-B' of FIG. 8B.

FIGS. 1A to 9 show process drawings, each illustrating a process for manufacturing the semiconductor device according to the invention. In FIGS. 1A to 8B, each of FIGS. 1A, 2A, 3A, 4A, 5A, 6A, 7A and 8A illustrates a plane view, and each of FIGS. 1B, 2B, 3B, 4B, 5B, 6B, 7B and 8B illustrates a cross sectional view taken in line A-A' of the corresponding plane view. FIG. 9 is a cross section of FIG. 8B taken in line B-B'. Identical reference numbers are assigned to the corresponding components in each drawings.

At first, as shown in FIG. 1, for example, a liquid material including minute metal particles and an organometallic compound are applied to a glass substrate 12 by means of a liquid ejection method (an ink jet method), followed by a drying process and a heat treatment process, resulting in forming a metal film, namely, a lower gate electrode (an electrode wiring) 14a which extends in one direction. Here, a primary insulating film (a protection film) may be provided on a surface of a glass substrate. With the primary insulating film, invasion of impurities from the glass substrate is avoidable, and thus relatively inexpensive glass substrate can be employed. As will be stated later, when a low temperature process is selected, the glass substrate (an insulating substrate) 12 is replaceable with a resin substrate such as a flexible PET or the like.

Examples of the minute metal particles include aluminum particles, gold particles, copper particles or the like. Examples of the organometallic compound include a compound or a complex including, for example, gold, silver, copper, palladium or the like as far as such compound or complex deposits metal when it is subjected to a thermal decomposition. More specifically, examples of such compound or complex may include chlorotriethylphosphine gold (I), chlorotrimethylphosphine gold (I), chlorotriphenylphosphine gold (I), silver (I) 2, 4-pentanedionato complex, trimethylphosphine (hexafluoroacetylacetonate) silver (I) complex, copper (I) hexafluoropentanedionatocyclooctadiene complex or the like.

Further, the lower gate electrode 14a which extends in one direction may be formed such that a high melting point metal is deposited by means of a spattering process, followed by a patterning process. Examples of the material for the lower gate electrode 14a include tungsten, molybdenum, aluminum or the like, which are selected as required. In the meantime, the lower gate electrode may also be a gate electrode made of polysilicon.

Secondly, a sacrifice layer 16 having a film thickness between about several nm and about 100 nm is formed over the lower gate electrode 14a where is corresponding to a channel area of a transistor. The sacrifice layer 16 will be removed later. The sacrifice layer 16 can be formed, for example, by applying resin to a targeted area by means of the liquid ejection method.

Further, the sacrifice layer 16 can be formed by applying a photosensitive resin by means of a spin coating process, followed by a desirable treatment such as baking or the like to form a film. Then, thus obtained film is subjected to a pattern exposure and a development to form the sacrifice layer 16 which partially covers the lower gate electrode 14a. The sacrifice layer 16 is made of a material which can obtain a selected ratio of a desirable etching rate with regard to the substrate 12, the primary insulating film of the substrate, the lower gate electrode film 14a and a semiconductor layer 18 when the etching is performed in order to remove the sacrifice layer. For example, a photoresist made of novolak resin may be employed. In the meantime, after the application of the resin to the sacrifice layer, if a UV irradiation is performed while heating the layer at a temperature between about 100 degrees Celsius and about 130 degrees Celsius, a heat resistance of the layer will develop and thus the sacrifice layer 16 can be prevented from a deformation or a reduction of volume while being subjected to the heating process up to a temperature between about 300 degrees Celsius and about 400 degrees Celsius.

In the meantime, the sacrifice layer 16 may be formed of a material which can be removed later such as a silicon oxide by means of the etching process or the like.

As illustrated in FIG. 2, the semiconductor layer 18 is formed over the sacrifice layer 16 in such a manner that the semiconductor layer crosses over the lower gate electrode 14a. The semiconductor layer 18 may, for example, be formed of amorphous silicon or polysilicon. Formation of a polysilicon layer may be done by applying liquid silicon to an area of the semiconductor layer on the substrate by means of the liquid ejecting method, followed by a drying process and a heating process. In the meantime, when the silicon oxide is used for the sacrifice layer 16, it is possible to form the semiconductor layer 18 by depositing a silicon layer by CVD method because the silicon oxide has a relatively high heat resistance temperature.

As illustrated in FIG. 3, the sacrifice layer 16 is removed to form a minute space (the empty space or a cavity) 20. For example, the resin layer can be removed using an oxygen plasma. The removal may also be done using a resist remove agent, a hot sulfuric acid or the like. In the meantime, when the silicon oxide is used for the sacrifice layer 16, a hydrofluoric acid, a nitric acid or the like can be used to remove the sacrifice layer.

As illustrated in FIG. 4, a gate insulating layer 22 is formed in such a manner that the gate insulating layer goes round the semiconductor layer 18 in an up-and-down direction. The gate insulating layer 22 is composed of a lower gate insulating layer 22a which fills the minor space 20 immediately below the semiconductor layer 18, and an upper gate insulating layer 22b which covers the semiconductor layer 18. The lower gate insulating layer 22a and the upper gate insulating layer 22b are formed, for example, in such a manner that polysilazane which is a liquid material is applied to the substrate by a spin coating method and the minor space 20 is filled to cover the semiconductor layer 18. Then, thus applied material is subjected to the drying process and the heat treatment (thermal oxidation) process under an oxygen environment to obtain a silicon oxide layer. A portion of this silicon oxide layer corresponding to the semiconductor layer is left as it is by a patterning process. In the meantime, the polysilazane which is the liquid material may be applied thereto by the liquid ejection method.

As stated above, the lower gate insulating layer 22a and the upper gate insulating layer 22b can advantageously be formed at the same time owing to the use of the liquid material; however, the lower gate insulating layer 22a and the upper gate insulating layer 22b may also be formed one by one. In this case, the lower gate insulating layer 22a and the upper gate insulating layer 22b can be formed of different materials or under different processing conditions.

As illustrated in FIG. 5, an upper gate electrode 14b is formed on the gate insulating layer 22b at a position corresponding to the lower gate electrode 14a. The upper gate electrode 14b can be formed in a similar manner as the lower gate electrode 14a. For example, as stated above, the upper gate electrode 14b to be connected to the lower gate electrode (electrode wiring) 14a is formed in such a manner that a high melting point metal is deposited by means of the spattering method, followed by the patterning process. Examples of the materials of the upper gate electrode 14b include the same materials as the lower gate electrode 14a, namely, the tungsten, the molybdenum, the aluminum, the polysilicon or the like, which may be selected as required.

As illustrated in FIG. 6, the semiconductor layer 18 is injected with impurity ion such as a boron, a phosphorous or the like using the upper gate electrode 14b as a mask, followed by the heat treatment process, to form a source area and a drain area.

As illustrated in FIG. 7, an interlayer insulator 30 is formed and contact holes are formed in the source area and the drain area of the semiconductor layer 18. The interlayer insulator 30 is formed, for example, by applying the polysilazane which is the liquid material to the substrate by the spin coating method, followed by the drying process and the heat treatment (heat oxidation) process under the oxygen environment, to thereby obtain the silicon oxide layer. Then, photo resist which is not shown here is applied thereto and patterns of the contact holes are exposed and developed with necessary treatment such as baking or the like in order to form an etching mask. With this etching mask, the interlayer insulator 30 and the upper gate insulating film 22b are subjected to an anisotropic etching process to form the contact holes 32 and 34 which contribute to expose the semiconductor layer 18.

As illustrated in FIG. 8, electrode wiring layers 36 for forming a source electrode, a drain electrode and a wiring are formed over the contact holes 32 and 34. The electrode wiring layers 36 are formed in such a manner that the liquid material including the minor metal particles such as the aluminum, the copper or the like or the organometalic compound is applied along the predetermined sections of the contact holes 32, 34 and an electrode wiring pattern by means of the liquid ejection method, followed by the drying process and the heat treatment process.

Further, the source electrode and the drain electrode may be formed of an organic conduction layer by using the liquid ejection method. A publicly known organic material with conductivity may be employed for the organic conduction layer. For example, PEDOT (poly-ethylendioxythiophene) which is a polymeric material with conductivity or the like can be employed.

In the meantime, the source electrode and the drain electrode may also be formed in such a manner that the metal material such as the aluminum or the like is deposited by the spattering method, followed by the patterning process.

FIG. 9 illustrates a schematic cross section of FIG. 8B taken in line B-B'. The semiconductor layer 18 of the transistor channel section is encircled by the gate insulating films 22 (the lower gate insulating film 22a, the upper gate insulating film 22b), and is further encompassed by the gate electrode 14. As such, the MOSTFT having the gate all around structure can be obtained.

Figures 10A, 10B:
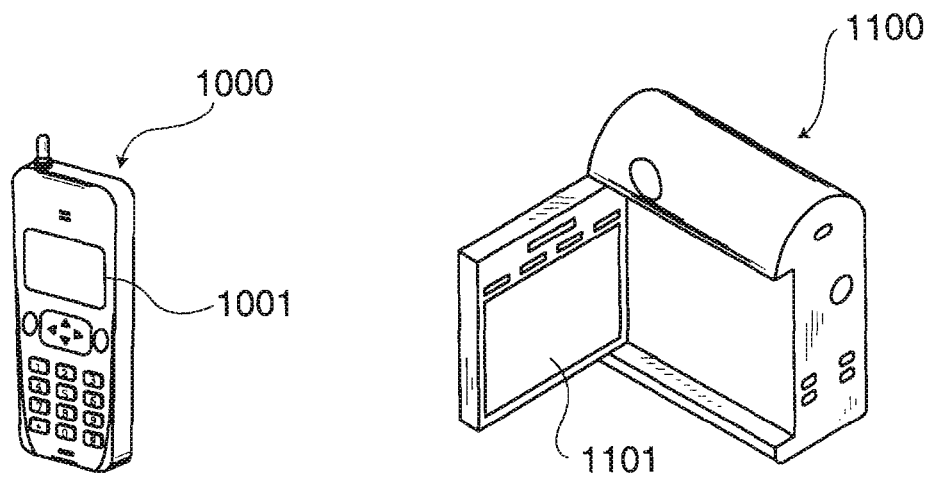
FIGS. 10A to 10C illustrate examples of electronic apparatus which uses the semiconductor device to which the invention is applied.
Figure 10C:
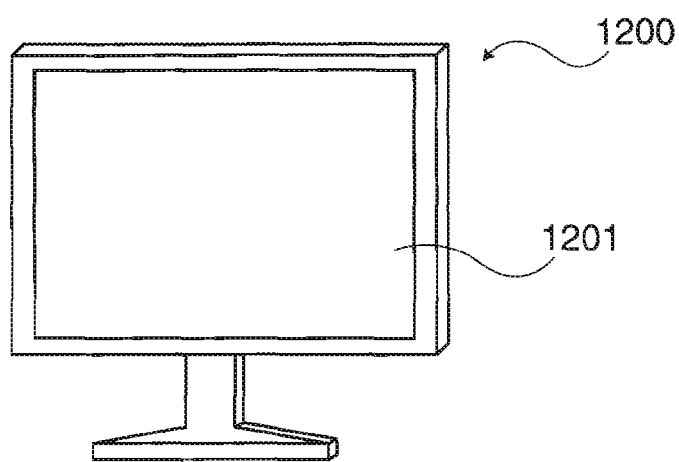

FIGS. 10A to 10C illustrate examples of the electronic apparatus for which the semiconductor device manufactured by the above stated manufacturing method is used. The semiconductor device is used, for example, as a pixel driving transistor of an electro-optic device such as a display for displaying information by modulating light or a light emitting device such as a liquid crystal device, an organic EL device or the like.

FIG. 10A illustrates an example of an application of the semiconductor device according to the invention to a cell phone, in which the cell phone 1000 has a display section 1001 which is composed of the above stated electro-optic device.

FIG. 10B illustrates an example of the application of the semiconductor device according to the invention to a video camera, in which the video camera 1100 has a display section 1101 which is composed of the above stated electro-optic device.

FIG. 10C illustrates an example of the application of the semiconductor device according to the invention to a television, in which the television 1200 has a display section 1201 which is composed of the above stated electro-optic device. In the meantime, the electro-optic device according to the invention is also applicable to a monitoring device to be used for a personal computer or the like.

As stated above, in the embodiment of the invention, the gate all around MOSFET can be formed through the manufacturing process with the liquid material, such that filling of the cavity which has been formed by using the sacrifice layer can be done with ease, and therefore, the manufacturing process of the gate all around MOSFET can be simplified.

Further, the gate all around MOSFET can be formed on the inexpensive substrate such as the glass substrate, the resin substrate or the like.

Still further, the gate all around MOSFET can be formed on the substrate having a large area such as the glass substrate or the resin substrate.

The entire disclosure of Japanese Patent Application No. 2005-375966, filed Dec. 12, 2005 is expressly incorporated by reference herein.

What is claimed is:

1. A method of manufacturing a semiconductor device comprising:
    forming a lower gate electrode over a substrate;
    forming a sacrifice film over the substrate such that the lower gate electrode is overlapped with the sacrifice film;
    forming a semiconductor film on the sacrifice film such that the semiconductor film crosses over the lower gate electrode;
    removing the sacrifice film;
    forming a lower gate insulating film in an empty space between the lower gate electrode and the semiconductor film, the empty space being obtained by removing the sacrifice film;
    forming an upper gate insulating film over the semiconductor film; and
    forming an upper gate electrode over the upper gate insulating film, the upper gate electrode being electrically connected to the lower gate electrode.

2. The method of manufacturing the semiconductor device according to claim 1, the lower gate insulating film being formed by applying a liquid material.

3. The method of manufacturing the semiconductor device according to claim 1, the upper gate insulating film being formed by applying a liquid material.

4. The method of manufacturing the semiconductor device according to claim 1, each of the gate insulating films including a thermally-oxidized film of the semiconductor film.

5. The method of manufacturing the semiconductor device according to claim 1, the lower gate electrode being formed by a liquid ejection method.

6. The method of manufacturing the semiconductor device according to claim 1, the sacrifice film being formed of an organic film.

7. The method of manufacturing the semiconductor device according to claim 1, wherein the sacrifice film is made of a material which can obtain a desired selected ratio with regard to the substrate or a primary insulating film formed on the substrate, the lower gate electrode film and the semiconductor film when the sacrifice film is removed.

8. The method of manufacturing the semiconductor device according to claim 1, the sacrifice film being formed by a liquid ejection method.

9. The method of manufacturing the semiconductor device according to claim 1, the semiconductor film being formed by a liquid ejection method.

10. The method of manufacturing the semiconductor device according to claim 1, a source area and a drain area being formed in the semiconductor film by an ion implantation using the upper gate electrode as a mask.

11. A method of manufacturing a semiconductor device comprising:
- forming a lower gate electrode over a substrate;
- forming a sacrifice film over the substrate such that the sacrifice film overlaps with the lower gate electrode;
- forming a semiconductor film over the sacrifice film such that the semiconductor film crosses over the lower gate electrode;
- forming an empty space between the lower gate electrode and the semiconductor film by removing the sacrifice film;
- forming a gate insulating film in the empty space and over the semiconductor film at a same process; and
- forming an upper gate electrode over a portion of the gate insulating film that is formed over the semiconductor film, the upper gate electrode being electrically connected to the lower gate electrode.

* * * * *